US006608318B1

(12) United States Patent
Perkins et al.

(10) Patent No.: US 6,608,318 B1
(45) Date of Patent: Aug. 19, 2003

(54) IONIZATION CHAMBER FOR REACTIVE SAMPLES

(75) Inventors: Patrick D. Perkins, Sunnyvale, CA (US); Jeffrey T. Kernan, Santa Cruz, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 266 days.

(21) Appl. No.: 09/629,467

(22) Filed: Jul. 31, 2000

(51) Int. Cl.[7] .......................... G21F 5/02; B01D 59/44; B05D 5/12; C23C 16/00; C23C 16/34

(52) U.S. Cl. .............................. 250/496.1; 250/423 R; 250/281; 250/288; 427/77; 427/255.36; 427/255.394

(58) Field of Search .......................... 250/496.1, 423 R, 250/281, 288; 427/77, 255.36, 255.394

(56) References Cited

U.S. PATENT DOCUMENTS

| | | | | | |
|---|---|---|---|---|---|
| 3,959,788 | A | * | 5/1976 | Tipton et al. | 340/237 S |
| 4,300,050 | A | * | 11/1981 | Hizo et al. | 250/374 |
| 4,853,536 | A | * | 8/1989 | Dempsey et al. | 250/253 |
| 4,999,162 | A | | 3/1991 | Wells et al. | 422/54 |
| 5,008,540 | A | * | 4/1991 | Dempsey | 250/336.1 |
| 5,055,674 | A | * | 10/1991 | Kotrappa | 250/255 |
| 5,055,678 | A | | 10/1991 | Taylor et al. | 250/291 |
| 5,184,019 | A | * | 2/1993 | MacArthur et al. | 250/380 |
| 5,268,200 | A | * | 12/1993 | Steger | 427/249 |
| 5,298,754 | A | * | 3/1994 | Anderson et al. | 250/379 |
| 5,633,497 | A | | 5/1997 | Brittain et al. | 250/292 |
| 5,796,100 | A | | 8/1998 | Palermo | 250/292 |
| 6,024,909 | A | * | 2/2000 | Yoshida et al. | 264/430 |
| 6,037,587 | A | | 3/2000 | Dowell et al. | 250/288 |
| 6,132,566 | A | * | 10/2000 | Hofmann et al. | 204/192.17 |

OTHER PUBLICATIONS

Hultman, L., "Thermal Stability of Nitride Thin Films", Vacuum Surface Engineering, Surface Instrumentation and Vacuum Technology, Vacuum 57 (2000), pp. 1–30.

* cited by examiner

*Primary Examiner*—John R. Lee
*Assistant Examiner*—Bernard Souw
(74) *Attorney, Agent, or Firm*—Timothy H. Joyce

(57) ABSTRACT

The present invention relates to a mass spectrometer that includes an ionization source having a chamber for ionizing a fluid sample. The ionization chamber has surfaces to reduce the overall interaction with reactive samples. The inner surface walls of the ionization chamber may be formed from an inorganic conductive nitride or disulfide material or may be applied to a substrate as a coating. The invention also includes a method for reducing the interaction of a reactive analyte with the inner wall of the chamber by application or coating the inner wall of the chamber with an inert conductive material.

10 Claims, 3 Drawing Sheets

| | RRF 160 ng | RRF 120 ng | RRF 80 ng | RRF 50 ng | RRF 20 ng | RRF 10 ng | Average RRF |
|---|---|---|---|---|---|---|---|
| Freshly cleaned 316 stainless steel ion source, no coating | 0.114 | 0.153 | 0.108 | 0.091 | 0.051 | 0.023 | 0.095 |
| Titanium nitride coated 316 stainless steel ion source | 0.229 | 0.230 | 0.223 | 0.214 | 0.198 | 0.150 | 0.207 |
| Tungsten disulfide coated 316 stainless steel ion source | 0.220 | 0.227 | 0.217 | 0.212 | 0.187 | 0.149 | 0.202 |

Figure 2

Relative response factors (RRFs) for 2,4-dinitrophenol as a function of the coating of the ion source

IONIZATION CHAMBER FOR REACTIVE SAMPLES

TECHNICAL FIELD

This invention relates generally to ion source chambers for use in conjunction with mass spectrometry. More particularly, the invention relates to an ionization chamber having a coated inner surface for reduced interaction with reactive samples.

BACKGROUND

Typical mass spectrometers contain an ion source having an ionization chamber. A sample containing an analyte is introduced into the ionization chamber through a means for sample introduction. Once the analyte is disposed within the ionization chamber, an ionization source produces ions from the sample. The resultant ions are then processed by at least one analyzer or filter that separates the ions according to their mass-to-charge ratio. The ions are collected in a detector, which measures the number and distribution of the ions, and a data processing system uses the measurements from the detector to produce the mass spectrum of the analyte. The sample can be in gaseous form or, depending upon the particular analyte separation and ionization means, can initially be a component of a liquid or gel.

There are many types of ionization sources that are useful in mass spectrometry (hereinafter referred to as MS). Types of ionization sources include, but are not limited to, electron impact, chemical ionization, plasma, fast ion or atom bombardment, field desorption, laser desorption, plasma desorption, thermospray and electrospray. Two of the most widely used ionization sources for gaseous analytes are the electron impact (hereinafter referred to as EI) and chemical ionization (hereinafter referred to as CI) sources.

An EI source generally contains a heated filament giving off electrons that are accelerated toward an anode and collide with gaseous analyte molecules introduced into the ionization chamber. Typically, the electrons have energies of about 70 eV and produce ions with an efficiency of less than a few percent. This energy is typically chosen because it is well in excess of the minimum energy required to ionize and fragment molecules and is at or near the peak of the ionization efficiency curve for most molecules. The total pressure within the ionization source is normally held at less than about $10^{-3}$ torr. The ions produced are extracted from the EI source with an applied electric field and introduced into an analyzer wherein they are separated by mass-to-charge ratio. The selected ions are registered as ion current characteristic of the specified mass/charge by the ion detection and signal processing system of the mass spectrometer. Those ions ideally do not collide with other molecules or surfaces from the time they are formed in the EI source until the time they are collected in the detector. An EI source is often employed in MS in conjunction with gas chromatography (GC), which separates constituents of the analyte by time of elution.

The EI ion source is often used with a quadrupole mass spectrometer for reasons of stability and reproducibility of ion-fragmentation patterns. The patterns produced are commonly called "classical" spectra and reflect the ion's molecular composition. In practice, by applying selected ion monitoring, the operator of such mass spectrometers monitors only those ions that indicate the presence of that compound. Thus the quality of the spectral pattern produced by the ion source may greatly effect the interpretation of data.

In EI, the character and quantity of analyzable ions from the molecules in the sample depend upon reactions occurring on the inner surfaces of the chamber containing the source of ionization. First, the analyte is introduced into an ionization chamber wherein ionization of the analyte is intended. Before ionization, however, much of the sample is exposed to inner surfaces of the chamber, which are usually heated. The interaction of the sample with these surfaces may create an undesired effect. For example, if a portion of the sample adheres to the chamber surface, the portion cannot be effectively ionized and directed to the detector. As a result, the sensitivity of the apparatus for analysis of that analyte may suffer. In addition, the sample can degrade, i.e., convert to other compounds or be adsorbed onto the surface of the chamber and desorb later. Depending upon the compound, many unexpected ions can appear as a result of the interaction of the compound with the surfaces. The results are undesirable: chromatographic peak tailing, loss of sensitivity, nonlinearity, erratic performance and the like. In addition, cleanliness is critical to the proper performance of the mass spectrometer using an EI source, particularly for quantitative analysis of material in a low concentration, such as for GC/MS analysis of pesticide residues, drug residues and metabolites, and trace analysis of organic compounds. Contamination is unacceptable in such analyses, so residual analytes or analyte reaction products from previous tests would not be tolerable. Often, abrasive cleaning is employed to ensure that the chamber is substantially contaminant free.

In contrast to the EI ion source, a CI source produces ions through collision of the molecules in the analyte with primary ions present in the ionization chamber or by attachment of low energy electrons present in the chamber. A CI source operates at much higher pressures than an EI source in order to permit frequent collisions. The overall pressure in a CI source during operation typically ranges from about 0.1 to about 2 torr. This pressure may be produced by the flow of a reagent gas, such as methane, isobutane, ammonia or the like, that is pumped into the chamber containing the CI source. In a typical configuration, both the reagent gas and the analyte are introduced through gas-tight seals into the chamber containing the CI source. The reagent gas and the analyte are sprayed with electrons having energies of 50 to 300 eV from a filament through a small orifice, generally less than 1 mm in diameter. Ions formed are extracted through another small orifice, also generally less than 1 mm in diameter, and introduced into the analyzer or filter. Electric fields may be applied inside the CI source, but they are usually not necessary for operation of the CI source. Ions eventually leave the CI source through a combination of diffusion and entrainment in the flow of the reagent gas. Thus, it is evident that CI sources operate in a substantially different manner from EI sources. However, the same undesired interactions of the sample with the source chamber surfaces may occur in a CI source as in an EI source as mentioned above.

Efforts have been made to address sample degradation problems in the ionization chamber of a mass spectrometer, particularly those containing an EI ion source, by substituting for or modifying the surfaces of the ionization chamber. Such efforts include providing a metallic surface with advantageous properties. For example, ionization chambers have been made with electropolished stainless steel surfaces in efforts to reduce he total active surface area. However, mass spectrometers using such ionization chambers have been found to give variable results and still exhibit degradation of the analyte over time. U.S. Pat. No. 5,055,678 to Taylor et al. describes the use of a chromium or oxidized chromium surface in a sample analyzing and ionizing apparatus, such as an ion trap or EI ionization chamber, to prevent degradation or decomposition of a sample in contact with the surface. This reference also describes that coating the inner surface of the ionization chamber with materials known for corrosion resistance or inertness, such as gold, nickel and rhodium, may reduce degradation of analytes, such as pesticides, drugs and metabolites, to some degree. Such surfaces suffer from a variety of drawbacks such as susceptibility to scratching when the metal coating is soft or assembly/diassembly difficulties when the coating has a high coefficient of friction.

In addition, U.S. Pat. No. 5,633,497 to Brittain et al. describes the use of a thin coating of an inert, inorganic non-metallic insulator or semiconductor material on the interior surfaces of an ion trap or EI ionization chamber to reduce adsorption, degradation or decomposition of a sample contacting the chamber surface. The material disclosed in this reference was fused silica, with aluminum oxide, silicon nitride and "selected semiconductors" given as alternative embodiments. Because these surface coatings exhibit high electrical resistivity, however, electrical charge can undesirably accumulate on these coatings if the coatings are too thick. The important feature of the invention described in this reference is the use of a sufficiently thin coating of insulator that charging effects do not occur.

U.S. Pat. No. 5,796,100 to Palermo discloses a quadrupole ion trap having inner surfaces formed from molybdenum.

In addition, U.S. Pat. No. 6,037,587 to Dowell et al. describes a mass spectrometer having a CI source containing a chemical ionization chamber having inner surfaces formed from molybdenum.

Others have attempted to prevent degradation problems by treating the inner metal surfaces of the analytical apparatus with a passivating agent to mask or destroy active surface sites. For example, alkylchlorosilanes and other silanizing agents have been used to treat injectors, chromatographic columns, transfer lines and detectors in GC. See, e.g., U.S. Pat. No. 4,999,162 to Wells et al. Such treatments have been successful in deactivating metal surfaces and thus have prevented degradation of some species of analyte. Unfortunately, the materials used for such treatments have a sufficiently high vapor pressure to introduce organic materials in the gas phase within the volume of the ionization chamber that are ionized along with the analyte, producing a high chemical background in the mass spectrum.

In the vital application of GC/MS to environmental testing for contamination, it has been found that certain important reactive analytes suffer degradation on the ion chamber surfaces of the prior art, with concomitant inaccuracies in identification and abundance determination. Such reactive analytes include, but are not limited to, acetophenone, 2-acetylaminofluorene, 1-acetyl-2-thiourea, aldrin, 4-aminobiphenyl, aramite, barban, benzidine, benzoic acid, benzo(a)pyrene, 1,4-dichlorobenzene, 2,4-dinitrophenol, hexachlorocyclopentadiene, 4-nitrophenol, N-nitroso-di-n-propylamine, and other compounds that occur in various solid waste matrices, soils, and water samples.

Thus, there is a need to reduce the adsorption, degradation and decomposition of these important analyte ions in an ionization chamber and to mitigate the problems associated with known coatings.

OBJECTS AND SUMMARY OF THE INVENTION

Accordingly, it is an object of the present invention to overcome the above-mentioned disadvantages of the prior art by providing an ionization chamber having an inner surface comprising an inorganic, conductive and mechanically robust compound that is inert to certain compounds that hitherto have been difficult to analyze.

It is another object of the invention to provide such an ionization chamber, particularly an EI chamber, for improved performance in a mass spectrometer.

Additional objects, advantages and novel features of the invention will be set forth in part in the description which follows, and in part will become apparent to those skilled in the art upon examination of the following, or may be learned by practice of the invention.

In a general aspect, then, the present invention relates to an ionization chamber of a mass spectrometer or MS system for ionizing a fluid sample. The chamber has an inner surface comprising an inorganic, conductive nitride compound. The nitride compound may be, for example, a titanium nitride or a mixed metal nitride such as an aluminum-titanium nitride or titanium-carbon-nitride.

In another aspect, the invention relates to the ionization chamber as above, wherein the inner surface of the chamber comprises an inorganic, conductive disulfide compound. The disulfide compound may be, for example, tungsten disulfide or molybdenum disulfide, and it may exhibit a layered microstructure.

In another general aspect, the present invention relates to an ionization chamber for ionizing a fluid sample, wherein the chamber has an inner surface comprising an inorganic, conductive compound having an electrical resistivity no greater than about $10^{-1}$ ohm-cm, preferably no greater than about $10^{-3}$ ohm-cm.

BRIEF DESCRIPTION OF THE FIGURES

The invention is described in detail below with reference to the following figure:

FIG. 2 is a table that compares relative response factors (RRFs) of 2,4-dinitrophenol for the following ion source surface materials: stainless steel; titanium nitride; and tungsten disulfide.

DETAILED DESCRIPTION OF THE INVENTION

Figure 1A:
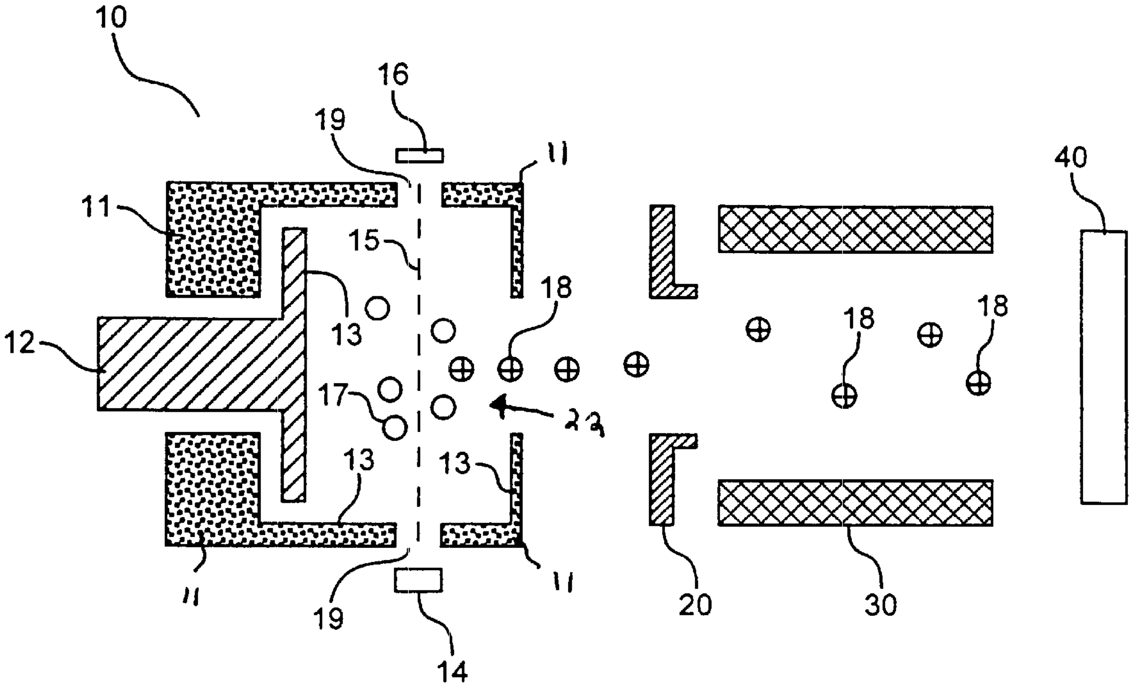
FIG. 1A is a simplified diagrammatic sketch in a section view showing a first embodiment of the mass spectrometer containing an EI chamber that incorporates the invention.

Before describing the invention in detail, it must be noted that, as used in this specification and the appended claims, the singular forms "a," "an," and "the" include plural referents unless the context clearly dictates otherwise. Thus, for example, reference to "a material" includes combinations of materials, reference to "a compound" includes admixtures of compounds, reference to "a disulfide" includes more than one disulfide, reference to "a nitride" includes a plurality of nitrides, and the like.

In describing and claiming the present invention, the following terminology will be used in accordance with the definitions set out below.

The term "ionization chamber" is used herein to refer to solid structure that substantially encloses a volume in which the sample, typically a gas, is ionized. The solid structure may also constitute part of a mass analyzer; for example, an ion trap wherein electron impact or chemical ionization occurs inside the trap.

The term "inner surface" as used herein refers to any surface within the chamber that can be subject to undesirable interaction with the analyte. The term encompasses surfaces of a component that may not be a part of the chamber but that is disposed within the chamber, such as means for sample introduction.

The term "microstructure" is used herein to refer to a microscopic structure of a material and encompasses concepts such as lattice structure, degrees of crystallinity, dislocations, grain boundaries and the like.

The term "nitride compound" is used in its conventional sense and refers to a compound containing nitrogen and at least one more electropositive element. Typically, nitrides exhibit a high degree of hardness and may have a wurtzite-like microstructure.

The term "resistivity" is used in its conventional sense and refers to a material's opposition to the flow of electric current. Unless otherwise specified, resistivity is measured in ohm-cm and is the inverse of "conductivity" which is measured in siemens/cm. A material's resistivity may vary according to temperature, and unless otherwise specified, resistivity is measured at room temperature. Semiconductors are considered to be relatively nonconductive at room temperature and at normal temperatures of operation of ion sources (<300° C.).

The term "disulfide compound" is used in its conventional sense and refers to a compound containing two sulfur atoms for each at least one more electropositive element. Typically, disulfides exhibit lubricating properties and may have a layered microstructure.

The term "metallic" as used herein refers to a material that has a low resistivity (less than $10^{-1}$ or 0.1 ohm-cm), that exhibits hardness and resistance to abrasion in thin film form, and that is inert toward the compounds described below. In particular, metallics are distinguished from insulators and ordinary semiconductors, which have resistivities much greater than $10^{1}$ or 10.0 ohm-cm. Metallics are further distinguished from pure metals, such as chromium, tungsten, iron, gold, molybdenum and their oxides, and compounds containing metalloids such as silicon nitride and nonmetals such as boron nitride.

Figure 1B:
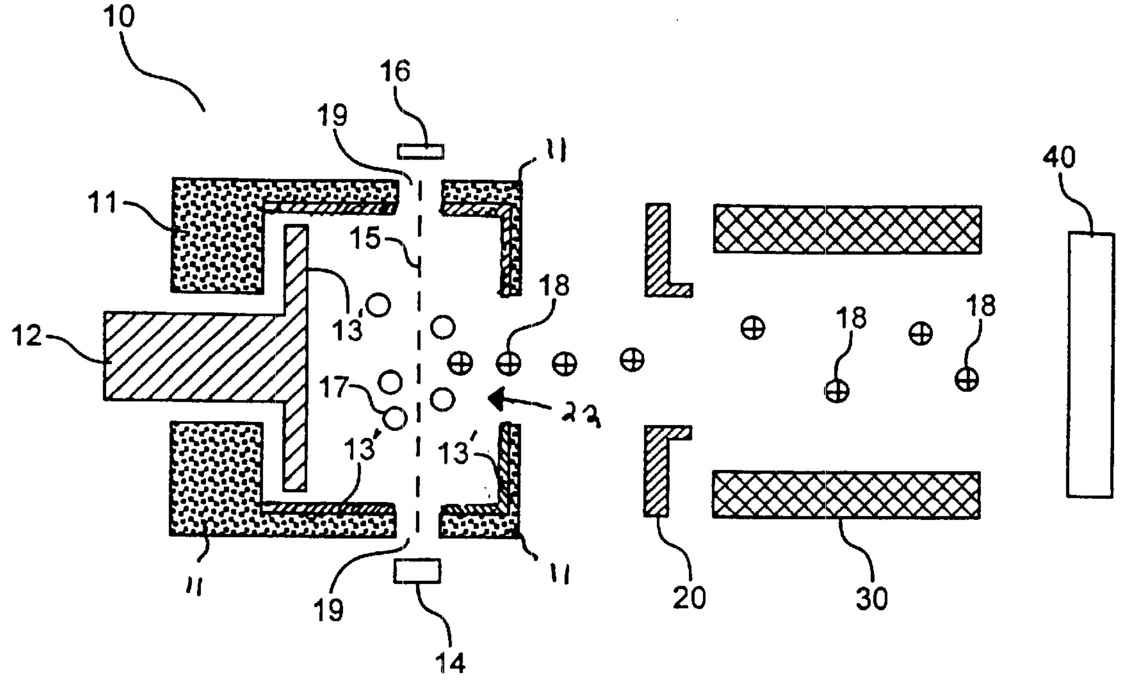
FIG. 1B is a simplified diagrammatic sketch in a section view showing a second embodiment of the mass spectrometer containing an EI chamber that incorporates the invention.

The invention is described herein with reference to the figures. The figures are not to scale, and in particular, certain dimensions may be exaggerated for clarity of presentation. FIG. 1A schematically illustrates a quadrupole mass spectrometer. Although the present example or diagram illustrates an EI source, the invention should not be construed narrowly to only this particular source and can be applied to other sources known in the art. An EI source 10 typically comprises an ionization housing or substrate 11, a repeller electrode 12 and inner surfaces 13 that define a chamber 22 (See FIG. 1A). Housing or substrate 11 may comprise any of the nitride and disulfide materials discussed below. In a second embodiment of the invention, inner surfaces 13' may be applied as a coating to substrate or housing 11 (See FIG. 1B). Coating 13' may comprise any of the nitride and disulfide materials discussed below. In this embodiment of the invention, substrate or housing 11 may comprise an electrically-conducting material. In the case of EI, the analyte gas 17 typically is introduced as a sample stream from a GC apparatus (not shown) into the chamber through an inlet orifice (not shown). An electron beam 15 that passes through orifices 19 into the chamber 22, from a filament 14 to an electron collector 16, interacts with the analyte molecules 17 of the analyte gas stream. The interaction results in formation of analyte ions 18 that are repelled by the repeller electrode 12 that is charged to a repelling voltage with respect to the ions. The repelling voltage has the same polarity as that of the analyte ions. The repelling force drives the ions through a lens system 20 and a mass analyzer 30 that selects the ions by mass-to-charge ratio. When the ions 18 reach the detector system 40, their abundance is measured to produce a mass spectrum for the sample. The quadrupole mass filter is preferred for the invention but various types of analyzers are also known in the art, e.g., ion traps, time-of-flight instruments and magnetic sector spectrometers.

It has now been discovered that inorganic, conductive nitride compounds unexpectedly render surfaces within an ionization chamber more inert with respect to certain known reactive analytes than typical chamber surface materials such as stainless steel, gold, nickel, chromium and chromium oxides, fused silica, aluminum oxide and molybdenum. Those reactive analytes include, but are not limited to, acetophenone, 2-acetylaminofluorene, 1-acetyl-2-thiourea, aldrin, 4-aminobiphenyl, aramite, barban, benzidine, benzoic acid, benzo(a)pyrene, 1,4-dichlorobenzene, 2,4-dinitrophenol, hexachlorocyclopentadiene, 4-nitrophenol, N-nitroso-di-n-propylamine, and other compounds that occur in various solid waste matrices, soils, and water samples. The conductive nitride compound may be a titanium nitride, or a mixed metal nitride such as an aluminum-titanium nitride. Titanium nitride exhibits exceptionally inert properties with respect to many such analytes. Other nitrides include, but are not limited to, titanium carbon nitride, titanium aluminum nitride, aluminum titanium nitride, chromium nitride, zirconium nitride and tungsten nitride. In addition, nitrides in general exhibit other properties that are particularly beneficial for mass spectrometry applications. For example, nitrides when coated on surfaces of ionization chambers are extremely hard and allow parts coated therewith to be cleaned using relatively hard abrasives. Nitrides of the present invention exhibit hardness greater than about 2000 kg/mm Knoop or Vicker Microhardness, typically about 2500 to about 3500. This translates to about 85 Rc. In addition, some nitrides exhibit microstructural polymorphism that may or may not depend on the stoichiometry of the compound. Polymorphism may be the result of how the compound is formed.

Alternatively, a preferred inner surface for an ionization chamber is a conductive disulfide compound. The disulfide compound may exhibit a layered microstructure. Examples of conductive disulfide layered compounds include, but are not limited to, tungsten disulfide, molybdenum disulfide, iron disulfide, copper disulfide, and titanium disulfide. These layered compounds are generally chemically inert at elevated temperatures. In particular, tungsten disulfide has unexpectedly been found to exhibit excellent inert properties in mass spectrometry applications. When surfaces of an ionization chamber are coated with a layered material such as tungsten disulfide, the layered compound provides lubrication that in turn facilitates assembly of components that formn the ionization chamber or that are disposed within the ionization chamber. Surprisingly, these materials have also been found to be inert with respect to certain known reactive analytes and to be hard and mechanically robust.

If the ionization chamber is coated with a dielectric, static charge will accumulate on the dielectric during the ionization process. Such charging will cause arcing resulting in a false signal, or such charge distribution may distort the field, thereby altering the ability of the ionization chamber to produce ions. Thus, if an inert coating is employed on any inner surface of the ionization chamber, it is preferred that the coating is sufficiently electrically conductive to allow dissipation of charge, as disclosed below. Materials having a lower resistivity may be deposited in a thicker coating on an inner surface of the ionization chamber. Irrespective of the resistivity of the coating, the coating should be uniformly deposited to insure that there are no uncoated areas or pinholes as well as to provide sufficient coverage to mask active sites on the surface. As is evident, any surface of the ionization chamber, including the surfaces of the electrodes, is subject to reaction with the uncharged reagent gas or the analyte.

In addition to unexpected inertness toward certain important reactive analyte substances, the compounds disclosed herein for use on ionization chamber inner surfaces exhibit certain other advantages. These compounds, having electrical resistivities no greater than about $10^{-1}$ ohm-cm, preferably no greater than about $10^{-3}$ ohm-cm, provide a conductive surface that resists charging by ion bombardment more than materials with higher resistivity. In particular, it is known that when typical insulating or semiconducting materials are used to provide a coating for ionization chamber surfaces, such coating usually cannot exceed about a thousand angstroms before an undesirable degree of electrical charging occurs due to accumulation of ions on the surface of the coating. The optimum thickness for avoiding charging is less than about two hundred angstroms. However, it is generally difficult to provide uniform coverage of a thin film coating over a surface; typically, thin coatings can contain pinholes or areas that are too thin to mask the reactive properties of the surface beneath the coating. Moreover, even if uniform coverage of a thin film is possible, thin films are less scratch resistant than thick films. Conducting films can be applied in any thickness without danger of charging, thus, conducting films are preferred over thin non-conducting films. In addition, since nitride compounds are harder than most metals, coatings of the present invention resist scratching better than metals and alloys that also exhibit low electrical resistivity. As an aside, for some ionic films deposited on a substrate surface, e.g., titanium nitride on a metal substrate, it has been observed that the hardness of the film depends on the hardness of the substrate.

Many ionic compounds do not exhibit electrical resistivity lower than about 10 ohm-cm. Typical ionic compounds, e.g., aluminum oxide, silicon nitrides and boron nitride, exhibit an electrical resistivity greater than about $10^{13}$ ohm-cm. Examples of metal nitrides with low resistivity include, but are not limited to, titanium nitride, zirconium nitride, chromium nitride and mixed-metal nitrides such as an aluminum-doped titanium nitride. In some conductive ionic materials, stoichiometry and microstructure can greatly affect the resistivity. However, one of ordinary skill in the art, through routine experimentation, can determine the optimum stoichiometry for any of the conductive compounds of the present invention, which can be produced using any of a number of techniques as disclosed herein. Preferably, the coating consists essentially of a nitride or disulfide compound with low resistivity as disclosed above.

There are many methods that can be employed to coat the compounds of the present invention onto the inner surface of an ionization chamber. One method involves a two-step process: depositing a thin layer of a metal or alloy on the surface of interest and exposing the surface to an appropriate element under reaction conditions effective to form the desired compound. There are many ways in which a thin layer of metal can be deposited, e.g., by evaporation, sputtering, electroplating, chemical vapor deposition (CVD), physical vapor deposition (PVD), etc, as is known in the art. It is notable, though, that not all methods of metallic layer deposition can be employed with ease for any particular metal. For example, a metal with a low melting point or boiling point temperature is particularly suitable for deposition through evaporation. Conversely, metals with a high melting point such as tungsten are not easily deposited through evaporation. Once a layer of metal is deposited, the layer can be exposed to a source of an appropriate electronegative element under suitable conditions to form the desired compound. For example, metal layer surfaces may be exposed to glow discharge plasma. With nitrides, a substrate having a metal layer surface is placed in a vacuum chamber. Then, ionized nitrogen gas is combined with other gases and a high voltage is applied to strike a glow to react with the substrate. It is evident that proper film formation conditions may involve high temperature processing; therefore, the material on which the surface is to be converted must be able to withstand all processing conditions. In addition, conversion of a metal layer into a compound of the present invention depends on the diffusion rate of the negatively charged species into the metal layer, and such conversion may be inefficient for some compounds of the present invention.

Alternatively, the compounds of the present invention may be deposited on the surface in vacuum processes that do not involve two discrete steps as described above. Such vacuum processes include, but are not limited to, cathodic arc PVD, electron-beam evaporation, enhanced arc PVD, CVD, magnetronic sputtering, molecular beam epitaxy, combinations of such techniques and a variety of other techniques known to one of ordinary skill in the art. One of ordinary skill in the art will recognize that CVD usually involves heating a substrate surface to a sufficiently high temperature to decompose gaseous organic species to form the desired film. Such heating usually precludes the use of plastic as a surface on which the film is deposited. PVD, on the other hand, does not necessarily exclude plastics as a substrate and allows for masked film deposition. However, the method coats only surfaces that are within the "line of sight" of the source of the coating material, and "blind" spots are not coated. In addition, some substrate heating may be employed in physical vapor deposition to promote film adhesion.

In the case of titanium nitride, hollow cathode discharge ion plating has been widely used. This method involves depositing titanium in the presence of nitrogen gas as a reactive gas. In hollow cathode discharge ion plating, dense films can be formed as titanium molecules are evaporated while nitrogen gas is introduced. Care must be taken, however, to ensure optimal deposition. If energy in the process is too low, the evaporated titanium does not react with the nitrogen and the resultant film does not adhere well to the surface. On the other hand, excessive energy results in re-evaporation from the substrate or damages to the surface.

The highly conductive surface of the invention can be provided using the above methods. As discussed above, the coating of the highly conductive material is thicker than ordinary semiconductor or insulator coatings. Generally, the coating of the invention can be deposited having a thickness from about 1000 angstroms to about 10 microns. Thicknesses achieved with PVD are normally about 0.5 to about 2 microns, and CVD processes normally result in thicknesses of about 2 to about 5 microns. It is notable that adhesion between the compound of the present invention and the surface tends to be of marginal quality at very high thicknesses. In addition, differences in thermal expansion coefficient between the coating layer and the surface on which the coating is deposited can also contribute to adhesion problems if the surfaces are subject to drastic changes in temperature.

The particular coating technique used generally affects the microstructure, morphology, and other physical characteristics of the deposited material. In addition, when the aforementioned deposition techniques are employed, variations in processing parameters can substantially change the morphology of the deposited film. In general, it is desirable to produce a smooth film of generally uniform thickness. Smooth films tend to provide a lower surface area, thereby rendering the film kinetically unfavorable for reaction with analytes. Smoothness of the film will, however, be highly dependent on, and in general determined by, the smoothness of the underlying surface.

As another alternative, the surface coating material can be applied as a powder. One method of powder application involves providing the conductive compound in powdered form and employing high pressure to spray the powder entrained in a fluid at high velocity such that the powder mechanically adheres to the surface. Another method involves suspending the powder in a solvent to form a paint, applying the paint onto the surface, and evaporating the solvent. The solvent can be a relatively inert carrier or one that facilitates chemical bonding between the powder particles or between the powder and the surface. In addition, heat can be applied to evaporate the solvent or to promote chemical bonding. Typically, no organic binder is used because organic materials generally outgas at sufficiently high vapor pressure to produce a gas phase that is ionized along with the sample, producing a high background in the mass spectrum. However, the film of the present invention does not necessarily preclude inclusion of a small amount of an organic binder if overall outgassing is sufficiently low. Typically, powder application is well suited for disulfides such as molybdenum disulfide, tungsten disulfide, chromium disulfide, etc. However, one drawback to this method is that the resulting coating does not withstand abrasive cleaning as well and may have to be reapplied over time.

Variation of the foregoing will be apparent to those of ordinary skill in the art. For example, while these coatings may be applied to surfaces composed of stainless steel, such coatings can also be applied to other surfaces such as aluminum or other structural materials that are typically used to form an ionization chamber or other components of a mass spectrometer. In addition, some compounds will be especially inert with respect to some analytes, and a particular coating may be applied to a surface that is designed for exposure to a specific analyte. For example, dinitrophenols are particularly reactive to components of conventional mass spectrometers. In contrast to the insulating and even conductive compounds used in the prior art, the conductive compounds of the invention, e.g., titanium nitride and various disulfides such as tungsten disulfide, have been found to exhibit unexpected inertness with,respect to dinitrophenols. Titanium nitride also exhibits unexpected inertness with respect to less reactive compounds than dinitrophenols.

It is to be understood that while the invention has been described in conjunction with the preferred specific embodiments thereof, that the foregoing description as well as the examples which follow is intended to illustrate and not limit the scope of the invention. Other aspects, advantages and modifications within the scope of the invention will be apparent to those skilled in the art to which the invention pertains.

All patents, patent applications, and publications mentioned-herein are hereby incorporated by reference in their entireties.

EXAMPLE 1

A freshly cleaned inner surface of a 316 stainless steel ionization chamber was provided in an ion source of a mass spectrometer made by Agilent Technologies. The inner surface was cleaned by abrasion. Acenaphthene-$d_{10}$, a calibration standard, in a standard concentration, $C_{is}$, of 40 ng/$\mu$L, was analyzed using the mass spectrometer. The response of the mass spectrometer at mass 164 was used for the detection of the acenaphthene-$d_{10}$. The analysis produced a peak area, $A_{is}$, for the internal standard. Then a series of analyte solutions were prepared that contained 2,4-dinitrophenol in concentrations, $C_s$, of 160, 120, 80, 50, 20 and 10 ng/$\mu$L. The response of the mass spectrometer at mass 184 was used for the detection of 2,4-dinitrophenol. Each solution was analyzed by the mass spectrometer, resulting in a series of peak areas, As. For each solution, a relative response factor (RRF) was determined according to the following equation:

$$\mathrm{RRF}=(A_s\times C_{is})/(A_{is}\times C_s). \tag{I}$$

The RRF for each solution is reported in FIG. 2. These RRFs provide a standard against which the inertness of coatings is evaluated.

EXAMPLE 2

An inner surface of the ionization chamber of Example 1 was coated with titanium nitride. The coating was applied by a commercial vendor. The series of analyte solutions containing 2,4-dinitrophenol was analyzed in the mass spectrometer. For each solution, RRF was determined according to equation (I). The RRF for each solution is reported in FIG. 2. It is evident that for all concentrations of 2,4-dinitrophenol, RRF was greater when a titanium nitride coating was employed. This indicates that the titanium nitride surface is less reactive with respect to 2,4-dinitrophenol than a freshly cleaned 316 stainless steel surface with no coating.

EXAMPLE 3

An inner surface of the ionization chamber of Example 1 coated with a layer of tungsten disulfide was provided in the mass spectrometer of Example 1. The coating was applied by subjecting the ion source to ajet of tungsten disulfide particles. The coating was sufficiently thick to obscure the shine of the stainless steel. The series of analyte solutions of Example 1 was analyzed in the mass spectrometer. For each solution, an RRF was determined according to equation (I). The RRF for each solution is reported in FIG. 2. It is evident that for all concentrations of 2,4-dinitrophenol, RRF was greater when a tungsten disulfide coated 316 stainless steel surface was employed. This indicates that the tungsten disulfide surface is less reactive with respect to 2,4-dinitrophenol than a freshly cleaned 316 stainless steel ion source with no coating.

What is claimed is:

1. A mass spectrometer comprising:

(a) an ion source having an ionization chamber for producing analyte ions from sample stream, said ionization chamber having an inner surface comprising an inert inorganic conductive material selected from the group consisting of nitrides and disulfides of metals;

(b) a mass analyzer coupled to said ion source for receiving said ions and for selecting the ions by mass-to-charge ratio; and (c) a detector system for connected to said mass analyzer measuring the abundance of-said selected ions.

2. A mass spectrometer as recited in claim 1, wherein said group consists of titanium nitride, titanium aluminum nitride, aluminum titanium nitride, titanium carbon nitride, chromium nitride, zirconium nitride, tungsten nitride, aluminum doped titanium nitride, molybdenum nitride, niobium nitride, vanadium nitride, tungsten disulfide, molybdenum disulfide, iron disulfide, copper disulfide and titanium disulfide.

3. A mass spectrometer as recited in claim 1, wherein said inner surface has a resistivity lower than 0.1 ohm-cm.

4. A mass spectrometer as recited in claim 1, wherein said inner surface has a resistivity lower than 0.01 ohm-cm.

5. A mass spectrometer as recited in claim 1, wherein said inner surface has a resistivity lower than 0.001 ohm-cm.

6. A mass spectrometer as recited in claim 1, wherein said inner surface is an outer surface of a coating.

7. A mass spectrometer as recited in claim 6, additionally comprising an electrically-conducting substrate positioned to support said coating.

8. A mass spectrometer as recited in claim 6, wherein said inner surface has a resistivity lower than 0.01 ohm-cm.

9. A mass spectrometer as recited in claim 6, wherein said inner surface has a resistivity lower than 0.01 ohm-cm.

10. A mass spectrometer as recited in claim 6, wherein said inner surface has a resistivity lower than 0.001 ohm-cm.

* * * * *